(12) United States Patent
Mantegazza et al.

(10) Patent No.: US 9,613,698 B2
(45) Date of Patent: Apr. 4, 2017

(54) SET AND RESET OPERATION IN PHASE CHANGE MEMORY AND ASSOCIATED TECHNIQUES AND CONFIGURATIONS

(71) Applicant: INTEL CORPORATION, Santa Clara, CA (US)

(72) Inventors: Davide Mantegazza, Palo Alto, CA (US); Kiran Pangal, Fremont, CA (US); Gerard H. Joyce, Folsom, CA (US); Prashant Damle, Portland, OR (US); Derchang Kau, Cupertino, CA (US); Davide Fugazza, Sunnyvale, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/154,465

(22) Filed: May 13, 2016

(65) Prior Publication Data

US 2016/0254052 A1 Sep. 1, 2016

Related U.S. Application Data

(62) Division of application No. 14/010,417, filed on Aug. 26, 2013, now Pat. No. 9,368,205.

(51) Int. Cl.
*G11C 13/00* (2006.01)

(52) U.S. Cl.
CPC ...... *G11C 13/0097* (2013.01); *G11C 13/0004* (2013.01); *G11C 13/0038* (2013.01); *G11C 13/0069* (2013.01); *G11C 2013/0092* (2013.01)

(58) Field of Classification Search
CPC ............ G11C 13/0097; G11C 13/0038; G11C 13/0069; G11C 13/0004; G11C 2013/0092
See application file for complete search history.

(56) References Cited

U.S. PATENT DOCUMENTS

2004/0184331 A1* 9/2004 Hanzawa ................. G11C 7/12
365/203
2006/0221678 A1* 10/2006 Bedeschi ............ G11C 11/5678
365/163

(Continued)

OTHER PUBLICATIONS

Pronin, A, et al., "Phase Change Memory: Fundamentals and Measurement Techniques," Keithley Instruments, Inc., Mar. 2010, pp. 1-4.

(Continued)

*Primary Examiner* — Khamdan Alrobaie
(74) *Attorney, Agent, or Firm* — Schwabe, Williamson & Wyatt, P.C.

(57) ABSTRACT

Embodiments of the present disclosure describe techniques and configurations for word-line path isolation in a phase change memory (PCM) device. In an embodiment, a method includes increasing a current through a memory cell of a phase change memory (PCM) device, wherein the memory cell is coupled with a capacitor and subsequent to said increasing the current, generating a transient current through the memory cell by discharge of the capacitor to reset the memory cell. In another embodiment, a method includes increasing a current through a memory cell of a phase change memory (PCM) device and controlling the current to be greater than a threshold current and lower than a hold current of the memory cell to set the memory cell. Other embodiments may be described and/or claimed.

15 Claims, 4 Drawing Sheets

(56) References Cited

U.S. PATENT DOCUMENTS

| | | | |
|---|---|---|---|
| 2008/0025089 A1* | 1/2008 | Scheuerlein | G11C 11/565 365/185.03 |
| 2008/0117669 A1* | 5/2008 | Fuji | G11C 13/0004 365/163 |
| 2009/0027951 A1* | 1/2009 | Kau | G11C 13/0004 365/163 |
| 2009/0116280 A1 | 5/2009 | Parkinson et al. | |
| 2009/0303785 A1* | 12/2009 | Hwang | G11C 5/147 365/163 |
| 2010/0165714 A1* | 7/2010 | Wu | G11C 13/0004 365/163 |
| 2011/0141798 A1* | 6/2011 | Kuo | G11C 11/40 365/163 |
| 2012/0026786 A1 | 2/2012 | Castro et al. | |
| 2013/0294152 A1* | 11/2013 | Kau | H01L 45/06 365/163 |
| 2013/0329485 A1* | 12/2013 | Takashima | G11C 13/0011 365/148 |
| 2014/0369132 A1 | 12/2014 | Cernea | |

OTHER PUBLICATIONS

Search Report mailed Oct. 26, 2015, issued in corresponding Taiwan (R.O.C.) Patent Application No. 103126915, 2 pages.
Non-Final Office Action mailed Sep. 22, 2015, issued in corresponding U.S. Appl. No. 14/010,417, filed Aug. 26, 2013.
Notice of Allowance mailed Feb. 16, 2016, issued in corresponding U.S. Appl. No. 14/010,417, filed Aug. 26, 2013.

\* cited by examiner

SET AND RESET OPERATION IN PHASE CHANGE MEMORY AND ASSOCIATED TECHNIQUES AND CONFIGURATIONS

CROSS REFERENCE TO RELATED APPLICATION

The present application is a division of U.S. patent application Ser. No. 14/010,417, filed Aug. 26, 2013, and entitled "SET AND RESET OPERATION IN PHASE CHANGE MEMORY AND ASSOCIATED TECHNIQUES AND CONFIGURATIONS," and the entire content and disclosure of which is hereby incorporated by reference in its entirety and for all purposes.

FIELD

Embodiments of the present disclosure generally relate to the field of integrated circuits, and more particularly, to set and reset operation in phase change memory.

BACKGROUND

Phase change memory (PCM) technology such as multi-stack cross-point PCM is a promising alternative to other non-volatile (NV) memory technology. Presently, parasitic effects may adversely affect selection/programming of a memory cell in a PCM device. For example, in cross-point array architecture, selection and de-selection operations may be performed using an ovonic threshold switch (OTS). Spikes of current and/or oscillations may occur when the OTS is switched between an off-state and an on-state, which may undesirably alter a programmed state of the memory cell. For example, such parasitic effects may over-reset a memory cell or result in uncontrolled parasitic oscillations during setting of a memory cell. Desirable developments in the industry include faster write mechanisms and lower power operation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe set and reset operation in phase change memory and associated techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Figure 1:
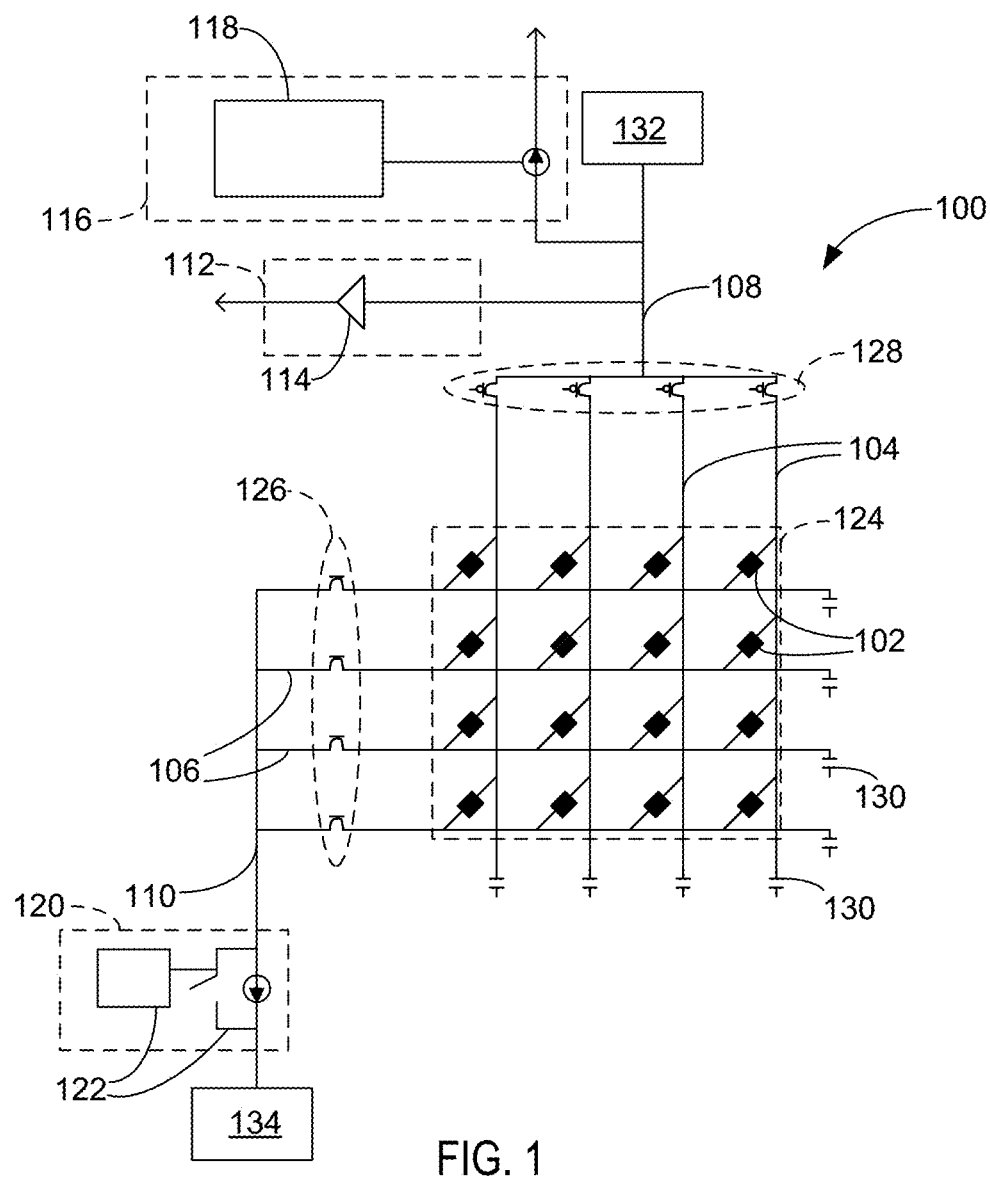
FIG. 1 schematically illustrates example circuitry of a phase change memory (PCM) device, in accordance with some embodiments.

FIG. 1 schematically illustrates example circuitry 100 of a phase change memory (PCM) device in accordance with some embodiments. According to various embodiments, the circuitry 100 may include one or more memory cells (hereinafter "memory cells 102"), which may be configured in an array as shown. The memory cells 102 may include, for example, a phase change material such as a chalcogenide glass that can be switched between crystalline and amorphous states with the application of heat produced by an electric current. The state (e.g., crystalline/amorphous) of the phase change material may correspond with a logical value (e.g., 1 or 0) of the memory cells 102. The circuitry 100 may be part of a phase change memory and switch (PCMS) device in some embodiments. The memory cells 102 may include a switch such as, for example, an ovonic threshold switch (OTS) configured for use in selection/programming operations of the memory cells 102. The circuitry 100 may be part of other suitable types of memory devices that benefit from the principles described herein.

The circuitry 100 may further include one or more bit-lines (hereinafter "bit-lines 104") and one or more word-lines (hereinafter "word-lines 106") coupled to the memory cells 102, as can be seen. The bit-lines 104 and word-lines 106 may be configured such that each of the memory cells 102 is disposed at an intersection of each individual bit-line and word-line. A voltage or bias can be applied to a target memory cell of the memory cells 102 using the word-lines 106 and the bit-lines 104 to select the target cell for a read or write operation. Bit-line drivers 128 may be coupled to the bit-lines 104 and word-line drivers 126 may be coupled to the word-lines 106 to facilitate decoding/selection of the one or more memory cells 102, as shown. Capacitors 130 and resistors (not shown) may be coupled to the bit-lines 104 and the word-lines 106, as can be seen. The capacitors 130 may represent parasitic elements in one or more embodiments.

The circuitry 100 may include one or more tiles 124. The one or more tiles 124 may comprise a portion of the array of one or more word-lines 106, bit-lines 104, and memory cells 102 that is treated as a discrete unit during a selection operation of a target memory cell. That is, in some embodiments, each of the one or more tiles 124 is a unit of the array that is biased to select the target memory cell (e.g., a bit) in the array. In the depicted embodiment, the one or more tiles 124 comprise an array of four word-lines and four bit-lines (4 WL×4 BL); however, other tile sizes can be used in other embodiments including, for example, a tile size of one thousand word-lines by one thousand bit-lines (1000 WL×1000 BL). The one or more tiles 124 may be part of any memory layer of a stacked memory configuration in some embodiments. For example, the one or more tiles 124 may be part of a memory layer formed on another memory layer, in some embodiments.

The bit-lines 104 may be coupled to a bit-line electrode 108, which may be further coupled to a bit-line supply 132 that is configured to provide an electrical supply for the bit-lines 104. The word-lines 106 may be coupled to a word-line electrode 110, which may be further coupled to a word-line supply 134 that is configured to provide an electrical supply for the word-lines 106. The bit-line electrode 108 and the word-line electrode 110 may each be a current path to the memory cells 102. The word-line drivers 126 and the bit-line drivers 128 may each comprise single or multiple transistors per electrode according to various embodiments. For embodiments where multiple transistors are used for each of the word-line drivers 126 and the bit-line drivers 128, the multiple transistors may be coupled to additional voltage supplies using additional word-line and/or bit-line electrodes that may similarly comport with embodiments described herein.

According to various embodiments, the word-line electrode 110 may have a relatively lower potential than the bit-line electrode 108. For example, the word-line electrode 110 may have a maximum voltage that is lower than a maximum voltage of the bit-line electrode 108. In some embodiments, the word-line electrode 110 may have a capacitance that is lower than a capacitance of the bit-line electrode 108.

In an embodiment, the circuitry 100 may include sensing circuitry 112 coupled to the bit-line electrode 108. The sensing circuitry 112 may use the bit-line electrode 108 as an electrical node for performing a read operation, such as a sense operation, of the memory cells 102. In one embodiment, the sensing circuitry 112 comprises a voltage comparator 114. For example, the sensing circuitry 112 may include a bit-line load connected to the bit-line electrode 108 to convert a current on the bit-line electrode 108 to a voltage that is a first input to the voltage comparator 114. An equivalent bit-line load may be connected to a reference current (not shown) to provide a voltage that is a second input to the voltage comparator 114. When a particular word-line and bit-line are selected in the array, the bit-line load on the bit-line electrode 108 may convert the current on the selected bit-line to a voltage. Leakage components of the current can be mitigated by respectively selecting a bias for all other unselected word-lines and bit-lines that reduces or minimizes leakage. Capacitive components of the current can be mitigated by allowing sufficient time for the capacitive components to dissipate. The current that is converted to the first input to the voltage comparator 114 may correspond with the current of the target memory cell. The reference current may be selected such that the current of the target memory cell is lower than the reference current before snap-back of the target memory cell and higher than the reference current after snap-back of the target memory cell. In this manner, an output of the voltage comparator 114 may be indicative of a state of the target memory cell. A latch (not shown) may be coupled to the voltage comparator 114 to store information associated with the read operation.

The circuitry 100 may further include write circuitry 116 coupled to the bit-line electrode 108. The write circuitry 116 may use the bit-line electrode 108 as an electrical node for performing a write operation, such as a set or reset operation, of the memory cells 102. The write circuitry 116 may include a current profile generator 118 that generates a current (e.g., a current pulse) for performing the write operation. According to various embodiments, the current profile may be generated such that the current in conjunction with transient/parasitic currents and/or oscillations between an on-state and off-state of the memory cell is configured to set or reset the memory cell.

The circuitry 100 may further include components of a selection module 120 coupled to the word-line electrode 110. Current-limiting circuitry 122 of the selection module 120 may be coupled to the word-line electrode 110 to facilitate a selection operation of the memory cells 102 using the word-line electrode 110. The selection operation may precede a read/write operation and place the target memory cell in a state to receive a read/write operation. During selection, a target memory cell may be moved from a subthreshold region of operation to a region of operation above a threshold region of operation by applying a voltage/bias across the target memory cell. The voltage bias to achieve selection of the target cell is provided by word-line and bit-line driver circuitry (e.g., which may be part of the selection module 120 in some embodiments) of the respective target word-line and the target bit-line in conjunction with the current-limiting circuitry 122. The target word-line bias and the target bit-line bias may be designed or selected such that, in combination, an overall bias is applied across the target cell that is sufficient to bring the target memory cell above a threshold voltage. In the present example, 'above the threshold voltage' may refer to a region of operation of a target memory cell that is capable of conducting sufficient current for a write operation, although a smaller current may maintain the target cell in the region of operation. The transition from subthreshold to the threshold or above threshold region may involve a 'snap-back' event where the voltage sustained by the target cell for a given current through the cell is suddenly reduced (see FIG. 3, for example). The current-limiting circuitry 122 may limit the current of the word-line electrode 110 to prevent damaging the target memory cell with excessive current. That is, limiting the maximum current of the word-line electrode 110 may also limit the maximum current through the one or more memory cells 102.

In an embodiment, the current-limiting circuitry 122 comprises a current mirror circuit. The current-limiting circuitry 122 may comprise a transistor gate that is configured to limit a current of the word-line electrode 110 to a maximum current level. For example, the transistor may be an n-type transistor having a gate that is controlled to an analog level such that the transistor delivers up to a maximum desired current. The current-limiting circuitry 122 may be enabled by applying a gate voltage to the transistor. The selection module 120 may include additional control circuitry to facilitate decoding of a target memory cell of the one or more memory cells 102 such that the target memory cell is moved from a subthreshold region of operation to a region of operation above a threshold region of operation, the threshold being a function of current.

According to various embodiments, the sensing circuitry 112, the write circuitry 116 and/or the selection module 120 may include or be part of other suitable circuitry or modules. For example, in some embodiments, the features 112, 116 and/or 120 may be suitably combined in one or more modules or may be coupled with the other of the bit-line electrode 108 and/or word-line electrode 110 than depicted. The circuitry 100 may be configured to perform actions of methods described herein, according to various embodiments. For example, the circuitry 100 may be coupled with one or more control modules configured to perform capacitor discharge based set and/or reset operations of a memory cell, according to embodiments described herein.

Figure 2:
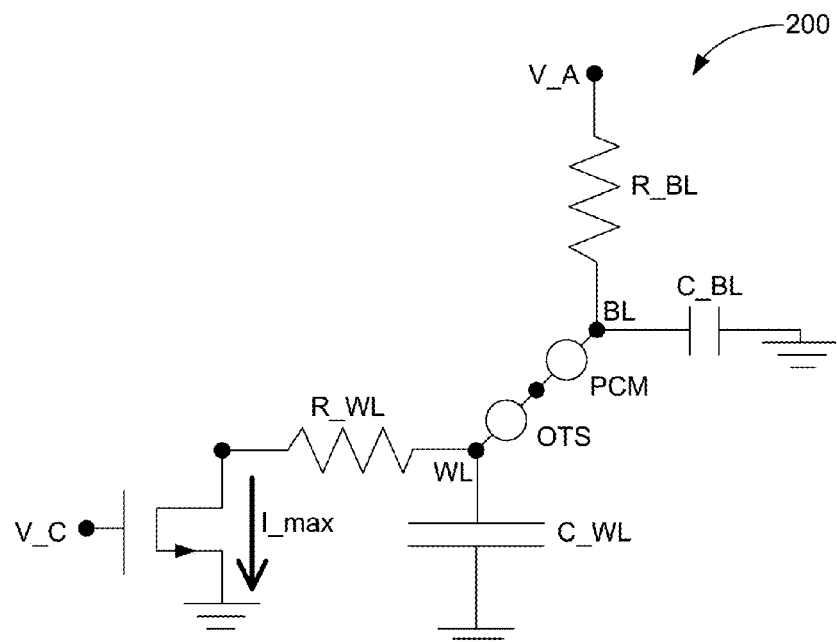
FIG. 2 schematically illustrates example circuitry corresponding with a memory cell of a PCM device, in accordance with some embodiments.

FIG. 2 schematically illustrates example circuitry 200 corresponding with a memory cell of a PCM device, in accordance with some embodiments. A memory cell (e.g., of the memory cells 102 of FIG. 1) may include a phase change material and a cell selector such as an ovonic threshold switch (OTS) coupled with a word-line (WL) node and a bit-line (BL) node, as can be seen, to provide a PCMS cell. The BL node may be coupled with one or more capacitors to provide a bit-line capacitance (C_BL) and one or more resistors to provide a bit-line resistance (R_BL). The WL node may be coupled with one or more capacitors to provide a word-line capacitance (C_WL) and one or more resistors to provide a word-line resistance (R_WL). The PCMS cell may be disposed between the WL and BL nodes, which may each have an equivalent parasitic capacitance in some embodiments.

According to some embodiments, a voltage may be applied to the bit-line to set or reset the PCMS cell. The applied voltage (V_A) may include, for example, a step-function voltage applied to a bit-line electrode to generate a current through the PCMS cell. For example, in a reset operation, an amount of current (e.g., a reset current) may be applied for an amount of time (e.g., a reset time) to transform the phase change material of the PCMS cell from a crystalline state to an amorphous state. In a set operation, an amount of current (e.g., a set current) may be applied for an amount of time (e.g., a set time) to transform the phase change material of the PCMS cell from an amorphous state to a crystalline state.

The current through the PCMS cell may be controlled at the WL side by a transistor such as, for example, a clamp transistor coupled with the WL node, as can be seen. In some embodiments, the transistor may be a metal-oxide-semiconductor field-effect transistor (MOSFET) and may have a configurable gate voltage such as clamp voltage (V_C) to set a maximum current (I_max) through the PCMS cell. The applied voltage V_A may turn on the OTS and the transistor, which may be accompanied by a snap-back event. The transistor may be configured to control an amplitude and/or time of the current to set or reset the cell by control of timing and setting of the clamp voltage (V_C).

Figure 3:
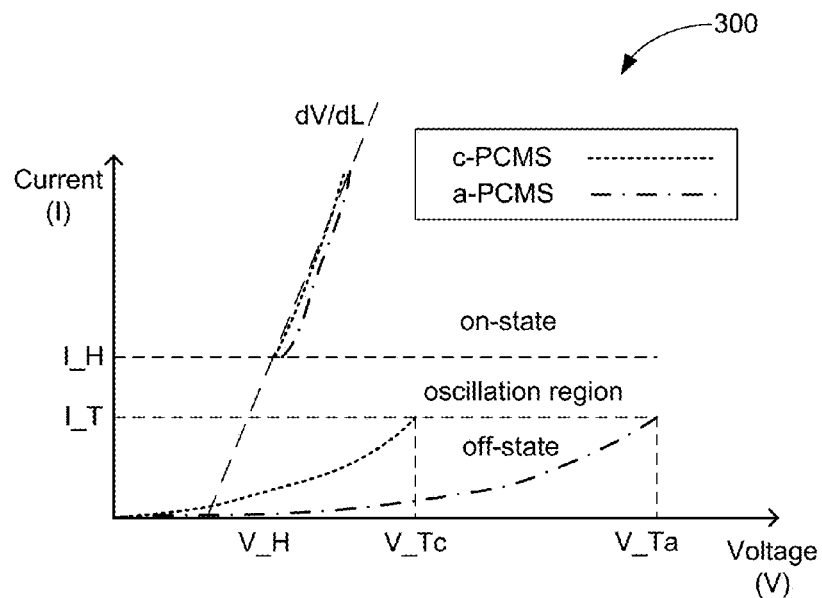
FIG. 3 is a graph depicting current-voltage (I-V) characteristics of a PCM and switch (PCMS) cell through transition between an off-state and an on-state for crystalline state and amorphous state, in accordance with some embodiments.

FIG. 3 is a graph 300 depicting current-voltage (I-V) characteristics of a PCM with switch (PCMS) cell through transition between an off-state and an on-state for crystalline state and amorphous state, in accordance with some embodiments. Referring to both FIGS. 2 and 3, a set operation of a PCMS cell in crystalline state (c-PCMS) and a reset operation of a PCMS cell in amorphous state (a-PCMS) may include increasing a current through the c-PCMS cell or a-PCMS cell to cause the respective cell to transition from a high resistive state (e.g., off-state) to a low resistive state (e.g., on-state). For example, an applied voltage V_A may increase current through the c-PCMS cell or a-PCMS cell to a threshold current (I_T) where the respective cell initially transitions from the off-state to the on-state. As can be seen, a threshold voltage (V_Tc) of the c-PCMS cell for a reset operation may be lower than a threshold voltage (V_Ta) of the a-PCMS cell for a set operation. The transition from the off-state to the on-state may result in a transient current to flow through the PCMS cell due to parasitic capacitance. A minimum current referred to as a hold current (I_H) and a minimum voltage referred to as a hold voltage (V_H) may sustain the on-state. If a current above the threshold current I_T and below the hold current I_H is applied, oscillations between the on-state and off-state may result (e.g., oscillation region). The graph 300 depicts a differential resistance dV/dI of the on-state.

According to various embodiments, turning on the PCMS cell may result in parasitic effects, which may be exploited in embodiments of the present disclosure to set or reset the PCMS cell. For example, initially the PCMS cell may be in the off-state and may be highly resistive. In this condition, energy of the applied voltage V_A may be stored at the bit-line capacitance C_BL and the word-line capacitance C_WL may be ~0 V. In response to transition from the off-state to the on-state, charge stored on the bit-line capacitance C_BL may be quickly (e.g., 1-2 nanoseconds) shared between the bit-line capacitance C_BL and the word-line capacitance C_WL generating a first transient current through the PCMS cell. Subsequent to transition from the off-state to the on-state, a voltage on the PCMS cell may be approximately equal to the hold voltage (V_H). That is, at first, extra applied voltage (V_A−V_H) may be distributed between WL and BL capacitance. The subsequent charge stored at the bit-line capacitance C_BL and the word-line capacitance C_WL may be used for both set and reset operations, according to various embodiments, and may be tuned or controlled to a selected level by setting values of the bit-line and wordline resistance (e.g., R_BL and R_WL) and capacitance (e.g., C_BL and C_WL).

For example, in a reset operation of the c-PCMS cell, another transient subsequent to the preceding transient may be generated to reset the c-PCMS cell. The subsequent transient may be a second transient to reach the steady state condition where the c-PCMS cell is in an on-state and capacitance displacement current is equal to 0. The second transient may include a generated (e.g., controlled or tuned) discharge of the word-line capacitance C_WL to reset the c-PCMS cell. The transistor may be set to a state (e.g., fully turned on, set to maximum current) to reduce or minimize resistance (e.g., by setting OTS close to or equal to ground) to facilitate the discharge of the word-line capacitance C_WL and the flow of current through the c-PCMS cell to reset the cell. For example, the clamp voltage V_C may be set at a level sufficient to induce a current that is higher than a peak current (I_peak) of the second transient.

The current (I_peak) flowing in the c-PCMS cell in the second transient may be determined by the voltage of the WL node (WL_crit_bias) after snap-back and by the word-line resistance R_WL. That is, the second transient may have a peak current (I_peak) based on the WL capacitance voltage once the first transient is concluded. For example, the peak current I_peak of the second transient may be estimated or calculated by dividing the voltage of the WL node WL_crit_bias by word-line resistance R_WL, where WL_crit_bias may be calculated by the following (V_A-V_H)*C_BL/(C_BL+C_WL), where dV/dI~0Ω assuming quick charge sharing between C_BL and C_WL.

The second transient may exponentially decay with a constant of time that is based on the circuit parasitic of the circuitry 200. The voltage of the WL node and R_WL may be tunable through the values of the bit-line and wordline resistance (e.g., R_BL and R_WL) and capacitance (e.g., C_BL and C_WL). The duration of the transient may be tunable by an RC constant of the circuitry 200, which may be also tunable through the values of the bit-line and wordline resistance (e.g., R_BL and R_WL) and capacitance (e.g., C_BL and C_WL). In some embodiments, the I_peak may be greater than a reset current used to perform a reset operation without using the second transient and the duration of the transient may be higher than twice the reset time of using a square pulse to perform a reset operation without using the second transient.

According to various embodiments, in a set operation of the a-PCMS cell, the current through the a-PCMS cell may be increased to a level that is in the oscillation region between the threshold current I_T and the hold current I_H. The oscillations between an on-state and off-state of the a-PCMS cell may be controlled to create an overall thermal profile in the cell to set the cell. For example, a clamp voltage V_C of the transistor may be set at level corresponding to a current level lower than a minimum current needed to sustain an on-state of the OTS. In this condition, the applied voltage V_A may cause the a-PCMS cell to transition from an off-state to an on-state, however, the current may not be sufficient to sustain the on-state (e.g., lower than the hold current I_H) and the a-PCMS cell may transition back to an off-state, followed by discharge of the WL capacitance (C_WL) by the transistor, which may, in turn increase a voltage on the a-PCMS cell causing a transition back to the on-state, and so forth, to provide the oscillations. The oscillations may correspond with a series of current pulses through the a-PCMS cell. A frequency and amplitude of the oscillations can be tuned with the RC of the circuit (e.g., by setting values of the bit-line and wordline resistance (e.g., R_BL and R_WL) and capacitance (e.g., C_BL and C_WL)). The duration of the oscillations can be controlled by the transistor (e.g., turned to off state) to provide the set time.

Using the transient current and oscillations as described above to reset or set the cell may provide a variety of benefits. For example, using the transient current to reset may reduce a likelihood of over-resetting, reduce current (and thus, power) and/or increase speed for resetting a cell. Using the oscillations may reduce current for setting the cell during a set operation. Utilizing these parasitic effects may reduce or eliminate any other deleterious effects caused by the parasitic effects. From being parasitic effects that have traditionally been avoided, the parasitic effects may now be used to facilitate operations of a PCM device.

Figure 4:
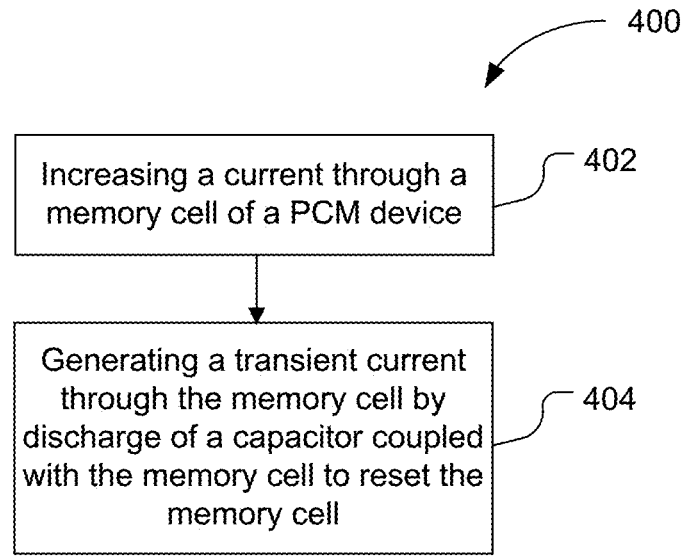
FIG. 4 is a flow diagram of a method for performing a reset operation of a PCM device, in accordance with some embodiments.

FIG. 4 is a flow diagram of a method 400 for performing a reset operation of a PCM device, in accordance with some embodiments. The method 400 may comport with embodiments described in connection with FIGS. 1-3 and vice versa.

At 402, the method 400 may include increasing a current through a memory cell (e.g., one of memory cells 102 of FIG. 1) of a PCM device (e.g., circuitry 100 or 200 of FIG. 1 or FIG. 2). In some embodiments, the current may be increased by applying a voltage to a bit-line coupled with the memory cell. The applied voltage may be a voltage greater than a threshold voltage of the memory cell to cause the memory cell to transition from an off-state to an on-state. In some embodiments, the memory cell includes a phase change material coupled with an OTS.

At 404, the method 400 may include generating a transient current (e.g., second transient described in connection with FIGS. 2-3) through the memory cell by discharge of a capacitor coupled with the memory cell to reset the memory cell. In some embodiments, the transient current is configured (e.g., tuned or controlled) to convert the phase change material from a crystalline state to an amorphous state.

In some embodiments, a transistor (e.g., clamp transistor) may be set to an on-state to allow discharge of wordline capacitance (e.g., C_WL) and subsequent to setting the transistor to the on-state, a voltage (e.g., V_A) may be applied to increase the current through the memory cell. The transient current (e.g., discharge of the wordline capacitance) may be generated in response to the memory cell entering an on-state based on increasing the current. Subsequent to exhaustion of the transient current to provide the reset operation, the transistor may be set to an off-state and the applied voltage (e.g., V_A) may be turned off.

In some embodiments, the capacitor is coupled with a word-line that is coupled with the memory cell. In some embodiments, the capacitor is a first capacitor and a second capacitor is coupled with a bit-line that is coupled with the memory cell. In some embodiments, the transient current is generated subsequent to a preceding transient current (e.g., first transient described in connection with FIGS. 2-3) that is generated by charge sharing between the first capacitor and the second capacitor. The charge sharing between the first capacitor and the second capacitor may be generated in response to the triggered on-state of the memory cell. In some embodiments, the preceding transient current charges, at least in part, the first capacitor prior to the discharge of the first capacitor.

Generating the transient current at 404 may include tuning and/or controlling the transient current to reset the memory cell. Resistance and/or capacitance of the word-line and/or bit-line may be tuned or otherwise controlled to provide a desired amplitude and duration of the transient current. In some embodiments, a first resistor may be coupled with the word-line and a second resistor may be coupled with the bit-line. Resistance of the first resistor or the second resistor and capacitance of the first capacitor or the second capacitor may be tuned to control an amplitude and duration of the transient current generated by the discharge of the first capacitor, in some embodiments.

In some embodiments, the word-line is coupled with a transistor (e.g., clamp transistor) configured to control flow of current through the memory cell. The transistor may control, for example, voltage of the word-line. In some embodiments, the transistor may be set to a state that allows the transient current to flow through the memory cell. For example, in some embodiments, a desired voltage of the transistor (e.g., a clamp voltage V_C) may be set prior to applying the applied voltage V_A, which may allow discharge of the word-line capacitance C_WL at the beginning of any set or reset operation. In some embodiments, the voltage of the transistor (e.g., V_C) may be set to a value to provide ohmic region operation of the transistor during the reset operation or saturation region operation of the transistor in the set operation with a saturation current below the hold current I_H.

Figure 5:
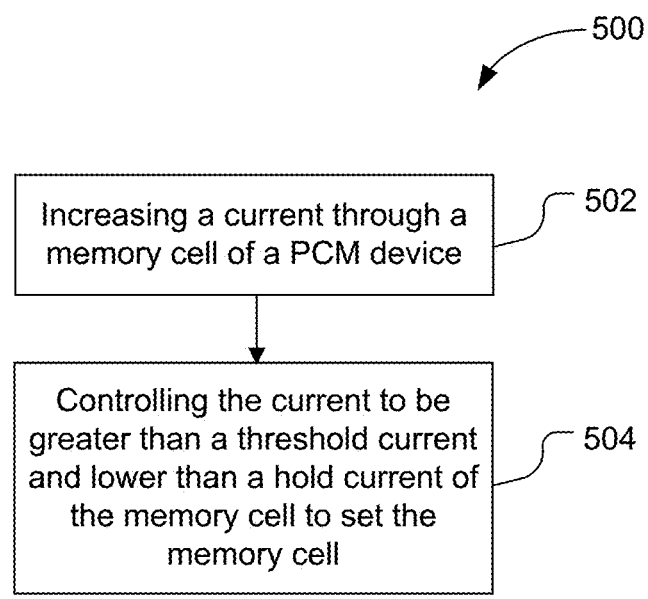
FIG. 5 is a flow diagram of a method for performing a set operation of a PCM device, in accordance with some embodiments.

FIG. 5 is a flow diagram of a method 500 for performing a set operation of a PCM device, in accordance with some embodiments. The method 500 may comport with embodiments described in connection with FIGS. 1-3 and vice versa.

At 502, the method 500 may include increasing a current through a memory cell (e.g., one of memory cells 102 of FIG. 1) of a PCM device (e.g., circuitry 100 or 200 of FIG. 1 or FIG. 2). In some embodiments, the current may be increased by applying a voltage to a bit-line coupled with the memory cell. The applied voltage may be a voltage greater than a threshold voltage of the memory cell to cause the memory cell to transition from an off-state to an on-state. In some embodiments, the memory cell includes a phase change material coupled with an OTS.

AT 504, the method 500 may include controlling the current to be greater than a threshold current (e.g., I_T of FIG. 3) and lower than a hold current (e.g., I_H of FIG. 3) of the memory cell to set the memory cell. Controlling the current may include setting a current level of a transistor (e.g., clamp transistor) coupled with the memory cell. For example, the transistor may be coupled with a word-line that is coupled with the memory cell.

In some embodiments, controlling the current may generate oscillations between an on-state and an off-state of the memory cell. The oscillations may correspond with current pulses that pass through the memory cell. An amplitude of the current and frequency of the oscillations may be tuned by setting resistance and/or capacitance values of circuitry (e.g., WL and BL of circuitry 200 of FIG. 2) coupled with the memory cell. A duration of the oscillations may be controlled by setting a value of the transistor. For example, a current level of the transistor may be set below the threshold current of the memory device when the oscillations are to stop to provide a set time of the memory cell.

The memory cell may include a phase change material coupled with an OTS. In some embodiments, a duration of the oscillations is configured (e.g., controlled) to convert the phase change material from an amorphous state to a crystalline state.

The actions of the methods 400 and 500 or other techniques described herein may be performed by any suitable module. For example, one or more control modules may be coupled to control the circuitry 100 or 200 of FIG. 1 or 2 to perform the actions described herein. An article of manufacture is disclosed. In some embodiments, the article of manufacture includes a non-transitory computer-readable storage medium. The article of manufacture may have instructions stored thereon, that if executed by a processor, cause the actions described herein to be performed. Any suitable apparatus including, for example, a PCM device may be equipped with any suitable means (e.g., the one or more control modules and/or circuitry 100 or 200 of FIG. 1 or 2) configured to perform actions described herein.

Figure 6:
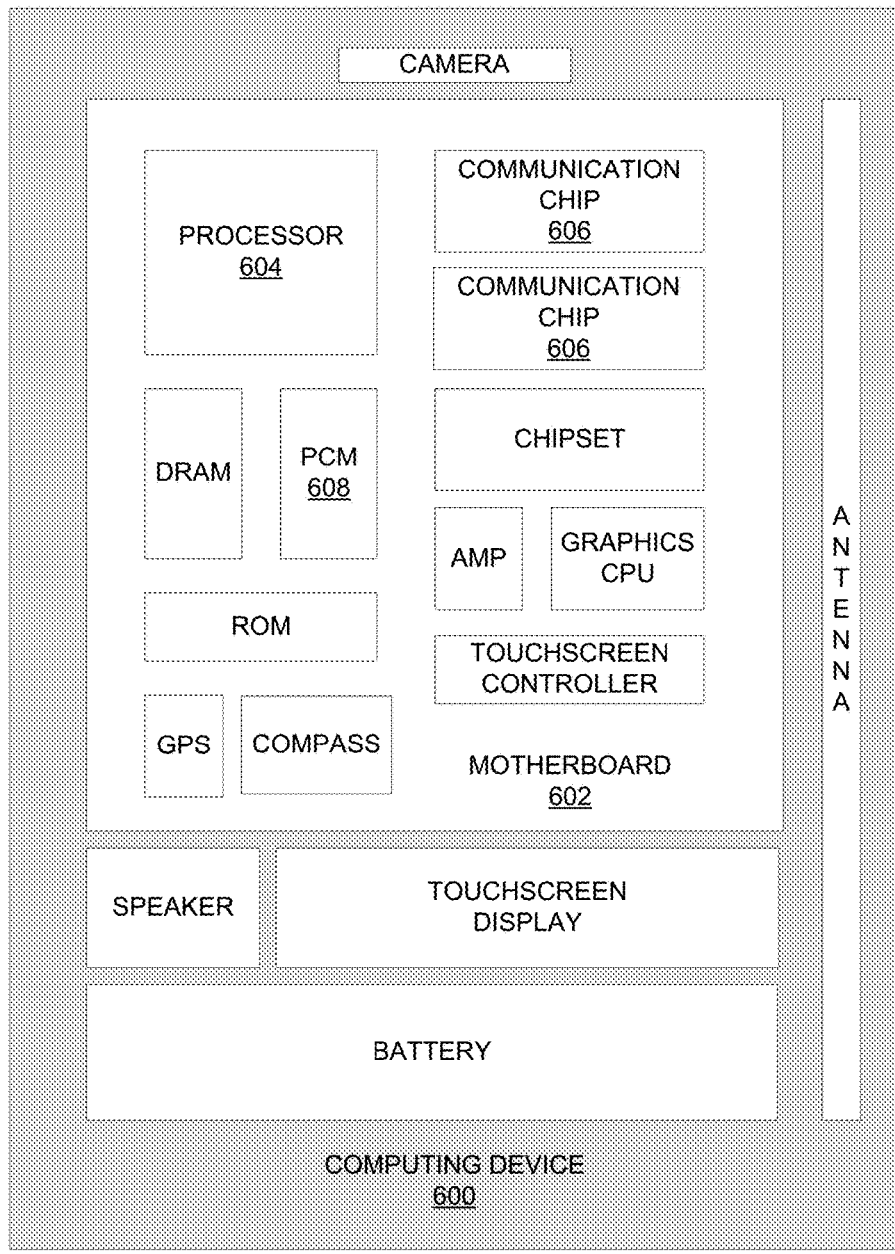
FIG. 6 schematically illustrates an example system that includes a PCM device having circuitry configured to perform actions in accordance with various embodiments described herein.

Embodiments of the present disclosure may be implemented into a system using any suitable hardware and/or software to configure as desired. FIG. 6 schematically illustrates an example system (e.g., a computing device 600) that includes a PCM device having circuitry (e.g., circuitry 100 or 200 of FIG. 1 or 2) configured to perform actions in accordance with various embodiments described herein. The computing device 600 may house a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., phase change memory (PCM 608) or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 608 may include circuitry (e.g., circuitry 100 or 200 of FIG. 1 or 2) that is configured to perform actions (e.g., method 400 or 500 of FIG. 4 or 5) described herein. For example, the PCM 608 may be configured to perform write operations (e.g., set or reset operations) using parasitic effects.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

According to various embodiments, the present disclosure describes a method of resetting a memory cell. Example 1 of the method includes increasing a current through a memory cell of a phase change memory (PCM) device, wherein the memory cell is coupled with a capacitor and subsequent to said increasing the current, generating a transient current through the memory cell by discharge of the capacitor to reset the memory cell. Example 2 includes the method of Example 1 wherein said increasing the current comprises applying a voltage to a bit-line coupled with the memory cell to trigger an on-state of the memory cell and the memory cell is coupled with a word-line and the capacitor is coupled with the word-line. Example 3 includes the method of Example 2, wherein the capacitor is a first capacitor and the bit-line is coupled with a second capacitor, said generating the transient current occurs subsequent to a preceding transient current that is generated by charge sharing between the first capacitor and the second capacitor, the charge sharing between the first capacitor and the second capacitor is generated in response to the triggered on-state of the memory cell and the preceding transient current charges, at least in part, the first capacitor prior to the discharge of the first capacitor. Example 4 includes the method of Example 3, wherein the word-line is coupled with a first resistor, the bit-line is coupled with a second resistor and resistance of the first resistor or the second resistor and capacitance of the first capacitor or the second capacitor are tuned to control an amplitude and duration of the transient current generated by the discharge of the first capacitor. Example 5 includes the method of Example 2, wherein the word-line is coupled with a transistor configured to control flow of current through the memory cell and the transistor is set to a state that allows the transient current to flow through the memory cell. Example 6 includes the method of Example 1 wherein the memory cell includes a phase change material coupled with an ovonic threshold switch (OTS) and the transient current is configured to convert the phase change material from a crystalline state to an amorphous state.

According to various embodiments, the present disclosure describes a method of setting a memory cell. Example 7 of the method includes increasing a current through a memory cell of a phase change memory (PCM) device and controlling the current to be greater than a threshold current and lower than a hold current of the memory cell to set the memory cell. Example 8 includes the method of Example 7, wherein said increasing the current comprises applying a voltage to a bit-line coupled with a memory cell. Example 9 includes the method of Example 8, wherein said controlling the current comprises setting a current level of a transistor coupled with the memory cell. Example 10 includes the method of Example 9, wherein said controlling the current generates oscillations between an on-state and an off-state of the memory cell and a resistance or capacitance of circuitry coupled with the memory cell is tuned to control an amplitude of the current and a frequency of the oscillations. Example 11 includes the method of Example 10, wherein the oscillations continue until the transistor is turned off. Example 12 includes the method of Example 10, wherein the memory cell includes a phase change material coupled with an ovonic threshold switch (OTS), a duration of the oscillations is configured to convert the phase change material from an amorphous state to a crystalline state.

According to various embodiments, the present disclosure describes an apparatus for resetting a memory cell. The apparatus of example 13 includes means for increasing a current through a memory cell of a phase change memory (PCM) device, wherein the memory cell is coupled with a capacitor and means for, subsequent to said increasing the current, generating a transient current through the memory cell by discharge of the capacitor to reset the memory cell. Example 14 includes the apparatus of Example 13, wherein the means for increasing the current comprises means for applying a voltage to a bit-line coupled with the memory cell to trigger an on-state of the memory cell and the memory cell is coupled with a word-line and the capacitor is coupled with the word-line. Example 15 includes the apparatus of Example 14, wherein the capacitor is a first capacitor and the bit-line is coupled with a second capacitor, the means for generating the transient current is configured to generate the transient current subsequent to a preceding transient current that is generated by charge sharing between the first capacitor and the second capacitor, the charge sharing between the first capacitor and the second capacitor is generated in response to the triggered on-state of the memory cell and the preceding transient current is configured to charge, at least in part, the first capacitor prior to the discharge of the first capacitor. Example 16 includes the apparatus of Example 15, wherein, the word-line is coupled with a first resistor, the bit-line is coupled with a second resistor and resistance of the first resistor or the second resistor and capacitance of the first capacitor or the second capacitor are tuned to control an amplitude and duration of the transient current generated by the discharge of the first capacitor. Example 17 includes the apparatus of Example 14, wherein the word-line is coupled with a transistor configured to control flow of current through the memory cell and the transistor is configurable to be set to a state that allows the transient current to flow through the memory cell. Example 18 includes the apparatus of Example 13, wherein the memory cell includes a phase change material coupled with an ovonic threshold switch (OTS) and the transient current is configured to convert the phase change material from a crystalline state to an amorphous state.

According to various embodiments, the present disclosure describes an apparatus for setting a memory cell. The apparatus of example 19 includes means for increasing a current through a memory cell of a phase change memory (PCM) device and means for controlling the current to be greater than a threshold current and lower than a hold current of the memory cell to set the memory cell. Example 20 includes the apparatus of Example 19, wherein the means for increasing the current comprises means for applying a voltage to a bit-line coupled with a memory cell. Example 21 includes the apparatus of Example 19, wherein the means for controlling the current comprises means for setting a current level of a transistor coupled with the memory cell. Example 22 includes the apparatus of Example 21, wherein the current generates oscillations between an on-state and an off-state of the memory cell and a resistance or capacitance of circuitry coupled with the memory cell is tuned to control an amplitude of the current and a frequency of the oscillations. Example 23 includes the apparatus of Example 22, wherein the oscillations continue until the transistor is turned off. Example 24 includes the apparatus of Example 22, wherein the memory cell includes a phase change material coupled with an ovonic threshold switch (OTS) and a duration of the oscillations is configured to convert the phase change material from an amorphous state to a crystalline state.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
    increasing a current through a memory cell of a phase change memory (PCM) device, the memory cell coupled with a transistor, the transistor directly coupled with a word-line of the PCM device, wherein increasing the current includes applying a voltage to a bit-line of the PCM device to trigger an on-state of the memory cell; and
    controlling the current to be greater than a threshold current and lower than a hold current of the memory cell to set the memory cell, wherein controlling the current includes applying a clamp voltage of the transistor at a voltage level that corresponds to a first current level that is lower than a second current level that is to sustain the on-state of the memory cell.

2. The method of claim 1, wherein increasing the current further includes causing a transient current to flow through the memory cell, in response to a transition of the memory cell from an off-state to the on-state.

3. The method of claim 1, wherein controlling the current includes controlling a timing of the clamp voltage of the transistor coupled with the memory cell.

4. The method of claim 1, wherein controlling the current includes causing oscillations to be generated between an on-state and an off-state of the memory cell, wherein a resistance or capacitance of circuitry coupled with the memory cell is tuned to control an amplitude of the current and a frequency of the oscillations.

5. The method of claim 4, further comprising: controlling a duration of the oscillations by turning off the transistor.

6. The method of claim 5, wherein the memory cell includes a phase change material coupled with an ovonic threshold switch (OTS), wherein the duration of the oscillations is to convert the phase change material from an amorphous state to a crystalline state.

7. The method of claim 1, wherein the transistor comprises a metal-oxide-semiconductor field effect transistor (MOSFET), wherein the clamp voltage comprises a gate voltage configurable to set a maximum current through the memory cell.

8. The method of claim 1, wherein the memory cell is coupled with a first capacitor, and a second capacitor, the first capacitor directly coupled with the word-line of the PCM device, and the second capacitor coupled with the bit-line of the PCM device.

9. An apparatus comprising:
    first circuitry to increase a current through a memory cell of a phase change memory (PCM) device, wherein the memory cell is coupled with a first capacitor, a second capacitor, and a transistor, wherein the first capacitor is directly coupled with a word-line of the PCM device, wherein the transistor is directly coupled with the word-line of the PCM device, and wherein the second capacitor is coupled with a bit-line of the PCM device, wherein to increase the current includes to apply a voltage to the bit-line to trigger an on-state of the memory cell; and
    second circuitry coupled with the first circuitry to control the current to be greater than a threshold current and lower than a hold current of the memory cell to set the memory cell, wherein to control the current includes to apply a clamp voltage of the transistor at a voltage level that corresponds to a first current level that is lower than a second current level that is to sustain the on-state of the memory cell.

10. The apparatus of claim 9, wherein the first circuitry is to cause a transient current to flow through the memory cell, in response to a transition of the memory cell from an off-state to the on-state.

11. The apparatus of claim 9, wherein the second circuitry to control the current includes to control a timing of the clamp voltage of the transistor coupled with the memory cell.

12. The apparatus of claim 11, wherein the second circuitry to control the current includes to cause oscillations to be generated between an on-state and an off-state of the memory cell, wherein a resistance or capacitance of circuitry coupled with the memory cell is tuned to control an amplitude of the current and a frequency of the oscillations.

13. The apparatus of claim 11, wherein the second circuitry is to control a duration of the oscillations, wherein to control the duration includes to turn off the transistor.

14. The apparatus of claim 13, wherein the memory cell includes a phase change material coupled with an ovonic threshold switch (OTS), wherein the duration of the oscillations is selected to convert the phase change material from an amorphous state to a crystalline state.

15. The apparatus of claim 9, wherein the transistor comprises a metal-oxide-semiconductor field effect transistor (MOSFET), wherein the clamp voltage comprises a gate voltage configurable to set a maximum current through the memory cell.

* * * * *